(12) United States Patent
Pelley et al.

(10) Patent No.: US 9,082,757 B2
(45) Date of Patent: Jul. 14, 2015

(54) STACKED SEMICONDUCTOR DEVICES (71) Applicants: Perry H. Pelley, Austin, TX (US); Kevin J. Hess, Austin, TX (US); Michael B. McShane, Austin, TX (US); Tab A. Stephens, Austin, TX (US)

(72) Inventors: Perry H. Pelley, Austin, TX (US); Kevin J. Hess, Austin, TX (US); Michael B. McShane, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/069,186

(22) Filed: Oct. 31, 2013

(65) Prior Publication Data

US 2015/0115463 A1     Apr. 30, 2015

(51) Int. Cl.
*H01L 23/48*     (2006.01)
*H01L 23/52*     (2006.01)
*H01L 29/40*     (2006.01)
*H01L 21/48*     (2006.01)

(52) U.S. Cl.
CPC ............ *H01L 23/481* (2013.01); *H01L 21/486* (2013.01); *H01L 21/4857* (2013.01)

(58) Field of Classification Search
CPC ............... H01L 2924/14; H01L 2924/01079; H01L 2924/01013; H01L 2924/01029; H01L 2924/01078; H01L 23/5226; H01L 23/481
USPC ............ 257/686, 773, 774, E23.067, E23.07, 257/706, 698, 713, 778, E21.505, E23.01, 257/E21.504, E21.511, E23.003, E23.021, 257/E23.124, E21.495, E21.509, E23.141, 257/E21.506, E23.101, E25.013, E23.011, 257/E21.499, E21.575, E23.08, E23.174, 257/E21.705, E29.02; 438/455, 456, 459, 438/667, 107–109, 621, 777, 622
See application file for complete search history.

(56) References Cited

U.S. PATENT DOCUMENTS

| | | |
|---|---|---|
| 5,019,943 A | 5/1991 | Fassbender |
| 5,675,180 A | 10/1997 | Pedersen et al. |
| 6,281,577 B1 | 8/2001 | Oppermann et al. |
| 6,664,485 B2 | 12/2003 | Bhatt et al. |
| 6,716,676 B2 | 4/2004 | Chen et al. |
| 7,271,482 B2 | 9/2007 | Kirby |
| 7,371,677 B2 | 5/2008 | Orlowski et al. |
| 7,759,800 B2 | 7/2010 | Rigg et al. |
| 7,777,330 B2 | 8/2010 | Pelley et al. |

(Continued)

OTHER PUBLICATIONS

U.S. Appl. No. 13/268,580, Pelley, P.H., Office Action—Rejection, mailed Jun. 16, 2014.

(Continued)

*Primary Examiner* — Julio J Maldonado
*Assistant Examiner* — Sheikh Maruf (57) ABSTRACT

A stacked semiconductor device includes a first and second semiconductor device having a first major surface and a second major surface opposite the first major surface, the first major surface of the first and second semiconductor devices include active circuitry. The first and second semiconductor devices are stacked so that the first major surface of the first semiconductor device faces the first major surface of the second semiconductor device. At least one continuous conductive via extends from the second major surface of the first semiconductor device to the first major surface of the second semiconductor device. Conductive material fills a cavity adjacent to the contact pad and is in contact with one side of the contact pad. Another side of the contact pad of the first semiconductor device faces and is in contact with another side of the contact pad of the second semiconductor device.

13 Claims, 6 Drawing Sheets

(56) References Cited

U.S. PATENT DOCUMENTS

| | | | |
|---|---|---|---|
| 7,928,590 B2 | 4/2011 | Wolter et al. | |
| 2001/0045645 A1 | 11/2001 | Sasaki et al. | |
| 2002/0182772 A1* | 12/2002 | Moden et al. | 438/109 |
| 2002/0190371 A1 | 12/2002 | Mashino et al. | |
| 2003/0080408 A1 | 5/2003 | Farnworth et al. | |
| 2003/0106212 A1 | 6/2003 | Chao et al. | |
| 2003/0107119 A1 | 6/2003 | Kim | |
| 2005/0051883 A1 | 3/2005 | Fukazawa | |
| 2005/0104219 A1 | 5/2005 | Matsui | |
| 2006/0216862 A1* | 9/2006 | Rigg et al. | 438/113 |
| 2006/0278979 A1 | 12/2006 | Rangel | |
| 2007/0181998 A1 | 8/2007 | Ha et al. | |
| 2008/0001283 A1 | 1/2008 | Lee et al. | |
| 2008/0284045 A1* | 11/2008 | Gerber et al. | 257/778 |
| 2009/0001543 A1 | 1/2009 | Chung | |
| 2009/0001602 A1* | 1/2009 | Chung | 257/777 |
| 2009/0014843 A1* | 1/2009 | Kawashita et al. | 257/621 |
| 2009/0032966 A1 | 2/2009 | Lee et al. | |
| 2009/0102038 A1 | 4/2009 | McElrea et al. | |
| 2009/0302435 A1 | 12/2009 | Pagaila et al. | |
| 2010/0007001 A1 | 1/2010 | Wang et al. | |
| 2010/0109137 A1 | 5/2010 | Sasaki | |
| 2010/0133645 A1* | 6/2010 | Dunne | 257/506 |
| 2010/0213603 A1* | 8/2010 | Smeys et al. | 257/698 |
| 2011/0024888 A1 | 2/2011 | Pagaila et al. | |
| 2011/0057306 A1 | 3/2011 | McShane et al. | |
| 2011/0156233 A1* | 6/2011 | Kim | 257/686 |
| 2011/0175215 A1* | 7/2011 | Farooq et al. | 257/686 |
| 2012/0038057 A1* | 2/2012 | Bartley et al. | 257/774 |
| 2013/0087926 A1 | 4/2013 | Pelley et al. | |
| 2013/0088255 A1 | 4/2013 | Pelley et al. | |
| 2013/0105991 A1* | 5/2013 | Gan et al. | 257/777 |
| 2014/0084444 A1* | 3/2014 | Lin | 257/698 |

OTHER PUBLICATIONS

U.S. Appl. No. 13/268,681, Pelley, P.H., Office Action—Allowance, mailed Mar. 31, 2014.

JEDEC Standard, High Speed Unterminated Logic, 'HSUL_12 LPDDR2 I/O, JESD8-22', JEDEC Solid State Technology Association, Aug. 2009.

JEDEC Publication, '3D Chip Stack with Through-Silicon Vias (TSVS): Identifying, Evaluating and Understanding Reliability Interactions, JEP158', JEDEC Solid State Technology Association, Nov. 2009.

U.S. Appl. No. 13/268,580, Pelley, et al., 'Stacked Semiconductor Die With Continuous Conductive Vias', office action—Restriction, mailed Nov. 23, 2012.

U.S. Appl. No. 13/268,580, Pelley, et al., 'Stacked Semiconductor Die With Continuous Conductive Vias', office action—Rejection, mailed Jan. 17, 2013.

U.S. Appl. No. 13/268,580, Pelley, et al., 'Stacked Semiconductor Die With Continuous Conductive Vias', office action—Allowance, mailed May 16, 2013.

U.S. Appl. No. 13/268,681, Pelley, et al., 'Stacked Semiconductor Devices', office action—Restriction, mailed Feb. 10, 2014.

Notice of Allowance mailed Nov. 3, 2014 for U.S. Appl. No. 13/268,580, 9 pages.

* cited by examiner

STACKED SEMICONDUCTOR DEVICES

BACKGROUND

1. Field of the Disclosure

This disclosure relates in general to semiconductor devices and more specifically to stacking multiple semiconductor devices.

2. Description of the Related Art

Conventional through-silicon-via (TSV) plugs for die stacking are formed at the single wafer level. The die are then interconnected into a stack with an interconnection at each wafer or die face. Height is added to the stack as a result of the bump standoff height at each die-to-die transition. Electrically, each interface contributes to reflections and added impedance which together reduce the high frequency signal integrity. Additionally, it is always desirable to dissipate heat from semiconductor devices to achieve smaller device sizes and higher frequency operation. In particular, stacked die generate heat in a small volume requiring additional thermal paths for heat dissipation.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the disclosure. The description is intended to be illustrative of the disclosure and should not be taken to be limiting.

Embodiments of a contiguous via plug through a die stack are disclosed that reduce the stack height and also improve high speed signaling performance. Thermal performance is improved by dissipating heat from conductive planes formed with beveled edges with a self-aligning heat sink. The beveled edges of the die also accommodate a self-aligning test probe that can be used to test functionality of the stacked semiconductor die.

Figure 1:
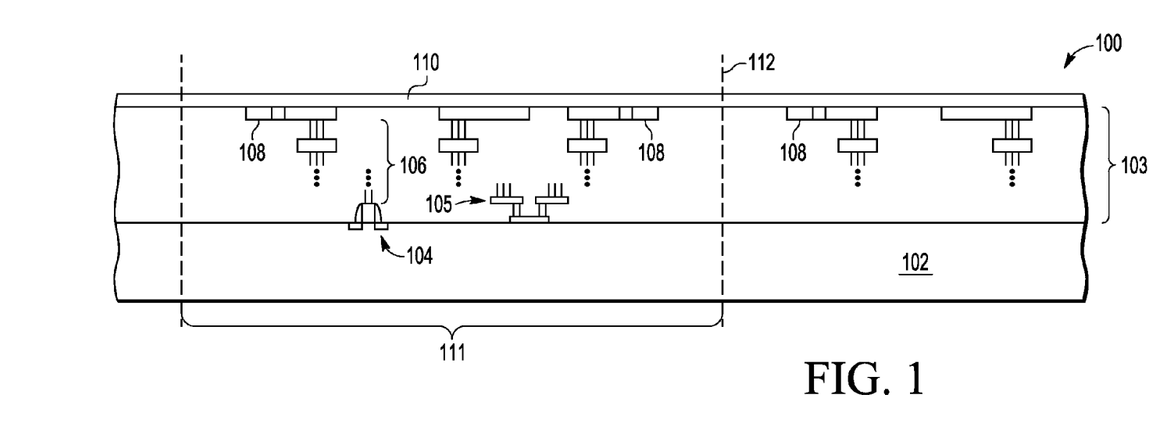
FIG. 1 is a partial side cross-sectional view of a semiconductor device after a phase of manufacture in accordance with an embodiment of the present disclosure.

FIG. 1 is a partial side cross-sectional view of an embodiment of semiconductor wafer 100 after a phase of manufacture that includes a semiconductor substrate 102 on which active surface and interconnect region 103 is formed that includes components such as N-type metal-oxide semiconductor (NMOS) and/or P-type metal-oxide semiconductor (PMOS) devices, such as transistors 104, capacitors, resistors, diodes, photo-diodes, fuses 105, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present disclosure and are not meant to limit the present disclosure in any manner. Other circuitry may be used as appropriate for a given application.

One or more layers of interconnects 106 can be formed to electrically couple active circuit components to other internal and/or external components. Electrical devices may also be formed in one or more dielectric layers. A dielectric or other insulating material can be formed in one or more layers as active surface and interconnect region 103 is formed to electrically isolate components from one another. A last layer of conductive interconnects including capture pads 108 is covered with passivation layer 110. Passivation layer 110 can be made of inorganic and/or organic layer of material such as silicon nitride, polyimide, or benzocyclobutene, to name a few.

Capture pads 108 and other interconnects may be formed, for example, by using photolithography techniques to deposit and pattern a photoresist material on an interlayer dielectric (ILD) material to expose portions of the ILD layer that are to become capture pads 108 and/or other interconnects. An etch process, such as an anisotropic dry etch process, may be used to create openings in the ILD layer. The openings can be lined with a diffusion barrier layer and/or an adhesion layer (not shown), and filled with a conductive material. The diffusion barrier layer can include one or more layers of TaN, Ta, TiN, Ti, CoW, or the like, and the conductive material can include copper, tungsten, aluminum, silver, and combinations thereof, or the like.

Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

A grid of die 111 may be formed on wafer 100, with die 111 separated from one another by scribe streets 112. Individual, independent semiconductor devices are formed by separating die 111 along scribe streets 112 once processing is completed.

Figure 2:
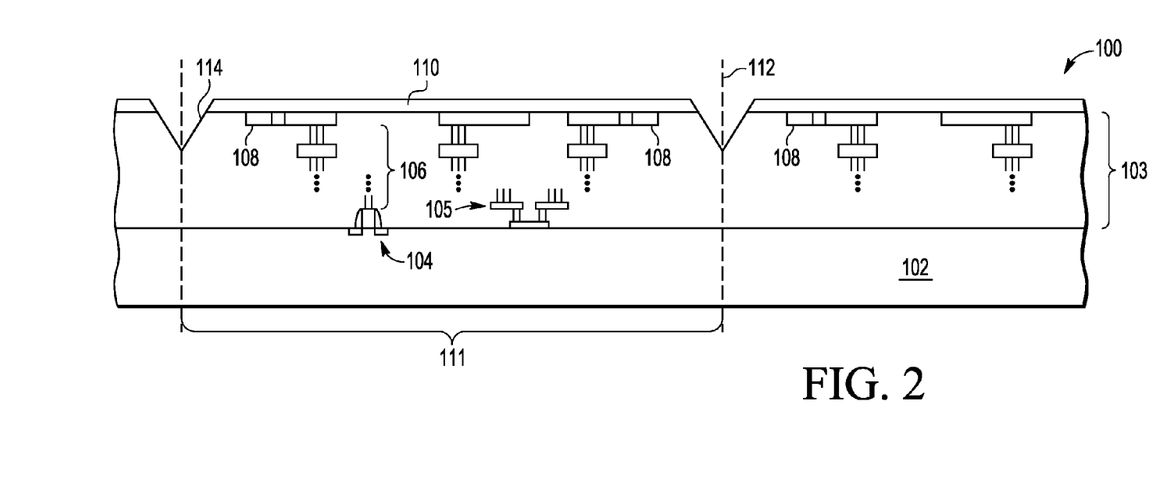
FIG. 2 is a partial side cross-sectional view of the semiconductor device of FIG. 1 after another phase of manufacture.

FIG. 2 is a partial side cross-sectional view of the wafer 100 of FIG. 1 after another phase of manufacture in which V-shaped bevels 114 are formed through passivation layer 110 and a portion of active surface and interconnect region 103 that is adjacent to passivation layer 110. Bevels 114 can be formed can be formed along horizontal and vertical scribe streets 112 using a saw, laser, or other suitable equipment. Any suitable dimension of bevel 114 to form test probe pads on exposed surfaces of the bevel can be used, and can be based on the size of the probe to be used during wafer testing. For example, for a probe with a contact tip that is 25 microns in diameter, bevels 114 can be approximately 70 microns in length along a bevel 114 that is angled, for example at 45 degrees, to the top surface of the semiconductor device. For a 25 micron diameter probe tip, a probe pad (not shown) formed on the bevel 114 can be 45 microns in width and spaced at least 5 microns from the next closest probe pad on the bevel. Other suitable dimensions can be used for the probe contact tip and probe pads.

Figure 3:
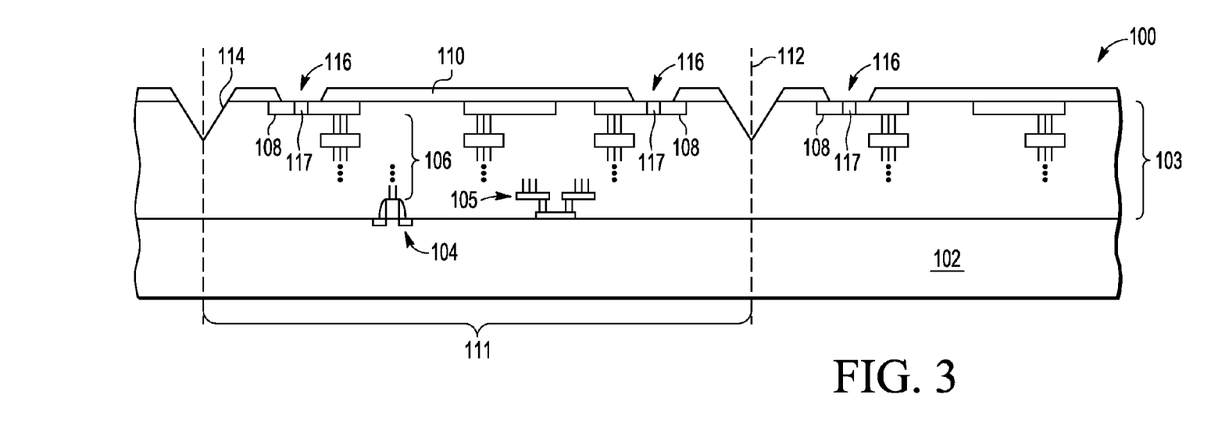
FIG. 3 is a partial side cross-sectional view of the semiconductor device of FIG. 2 after another phase of manufacture.

FIG. 3 is a partial side cross-sectional view of the wafer 100 of FIG. 2 after another phase of manufacture in which openings 116 are formed around an opening 117 in capture pads 108. Openings 116 typically are larger than and extend beyond the opening 117 in capture pads 108. Openings 117 can be in the range of 2-20 microns in diameter and openings 116 can be in the range of 5-60 microns, or other suitable dimensions. Depending on the material used for passivation layer 110, openings 116 can be formed using a standard etch and/or photoimageable or patterning techniques.

Figure 4:
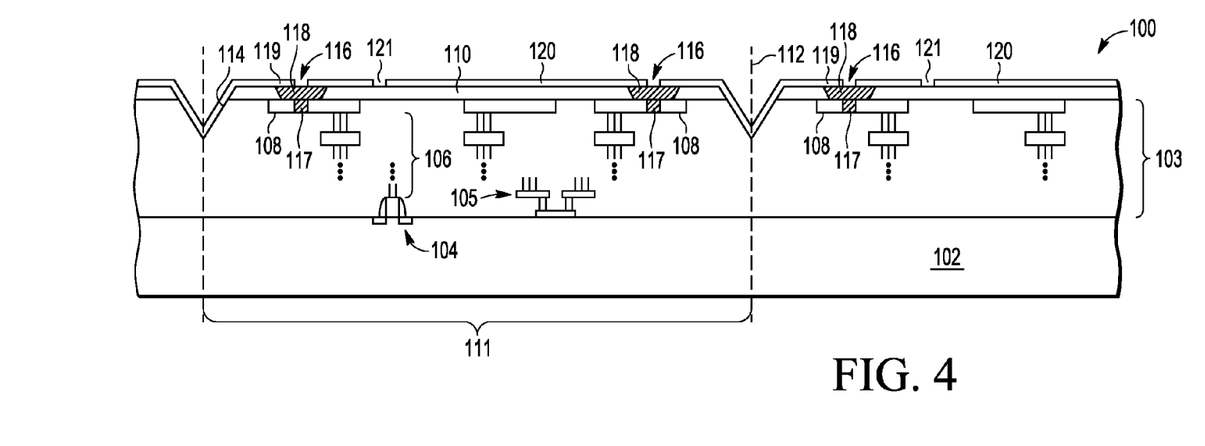
FIG. 4 is a partial side cross-sectional view of the semiconductor device of FIG. 3 after another phase of manufacture.

FIG. 4 is a partial side cross-sectional view of the wafer 100 of FIG. 3 after another phase of manufacture in which sacrificial material 118 is deposited in openings 116. The sacrificial material 118 may be an oxide or other suitable material that can be selectively removed during a subsequent phase of manufacture while leaving other components of device 100 intact. Sacrificial material 118 can be deposited to the top of openings 116, or at a suitable level below the top of openings 116.

Figure 5:
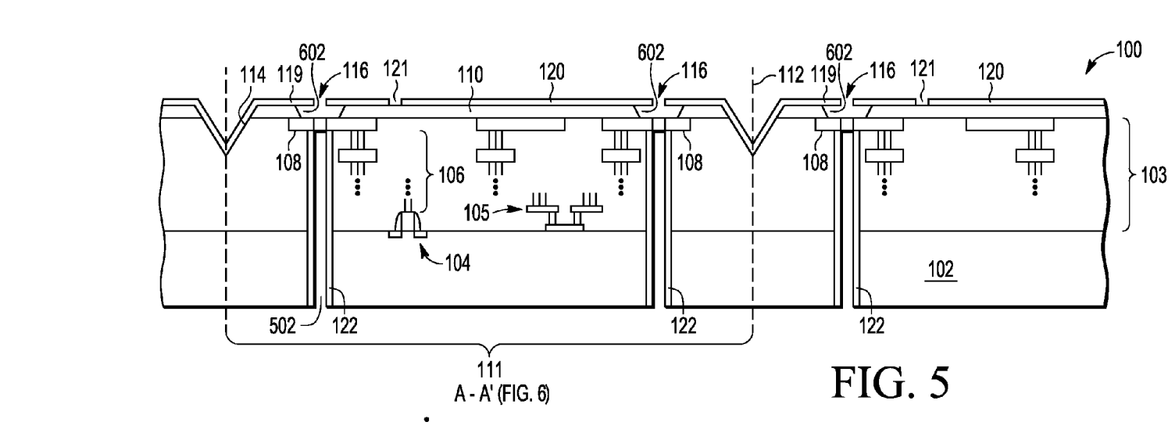
FIG. 5 is a partial side cross-sectional view of the semiconductor device of FIG. 4 after another phase of manufacture.

A patterned conductive layer including contact pads 119 is formed over passivation layer 110 and sacrificial material 118, but not over portions of sacrificial material 118 that is aligned with openings 117 in capture pads 108. Conductive layer 120 is patterned over passivation layer 110 and sacrificial material 117 with gaps 121 in the conductive layer to separate different signal or power connections. A portion of contact pads 119 are in contact with a top surface of the sacrificial material 118. The conductive material can include copper, tungsten, aluminum, and combinations thereof, or the like that is formed with electroplating, sputtering, or other suitable process. Contact pads 119 and the signals and power connections 120 form a top layer of wafer 100. In some embodiments the contact pads 108 may provide physical structure only and may not have any connection to the underlying metal layers or active circuitry. FIG. 5 is a partial side cross-sectional view A-A' of the wafer 100 of FIG. 4 after another phase of manufacture in which sacrificial material 118 is removed and openings 116 are extended to create openings 502 for through substrate vias through active surface and interconnect region 103 and substrate 102. Sacrificial material 118 may be removed and openings 502 may be formed by etching or other suitable techniques. It should be understood that the etch processes may be accomplished in single etch processes or multiple etch processes. It should also be understood that the openings 502 may be formed by other methods, such as milling, laser techniques, or the like. With sacrificial material 118 is removed, contact pads 119 are cantilevered or unsupported over openings 116.

Once sacrificial material 118 is removed and openings 502 are formed, a layer of electrical isolation material such as an insulator layer 122 is formed on the sidewalls of openings 502. Insulator layer 122 may be formed using a CVD, spin-on coating or epitaxial process to form a dielectric layer that covers the sidewalls of the openings 116. The dielectric constant of the insulator layer 122 can be less than about 6 microns or other suitable value and may be formed, for example, of materials used to form interconnects, by any suitable method known in the art. Other suitable materials and application methods may be used for insulator layer 122. The TSVs comprising opening 502, the opening in contact pad 108, and cavity 602, will be filled with a conductive material after the substrate stacking shown in FIG. 7 described below. The insulator 122 will provide isolation between the conductive material and the substrate 102 and only thick enough to form a sufficient isolation and acceptable capacitance along the sidewall of the TSV. Furthermore, the relatively thin isolation structure of insulator 122 creates an increased effective area the conductive material of through silicon vias (TSV) 802 (FIG. 8), thus increasing the effectiveness of the TSV 802.

Figure 6:
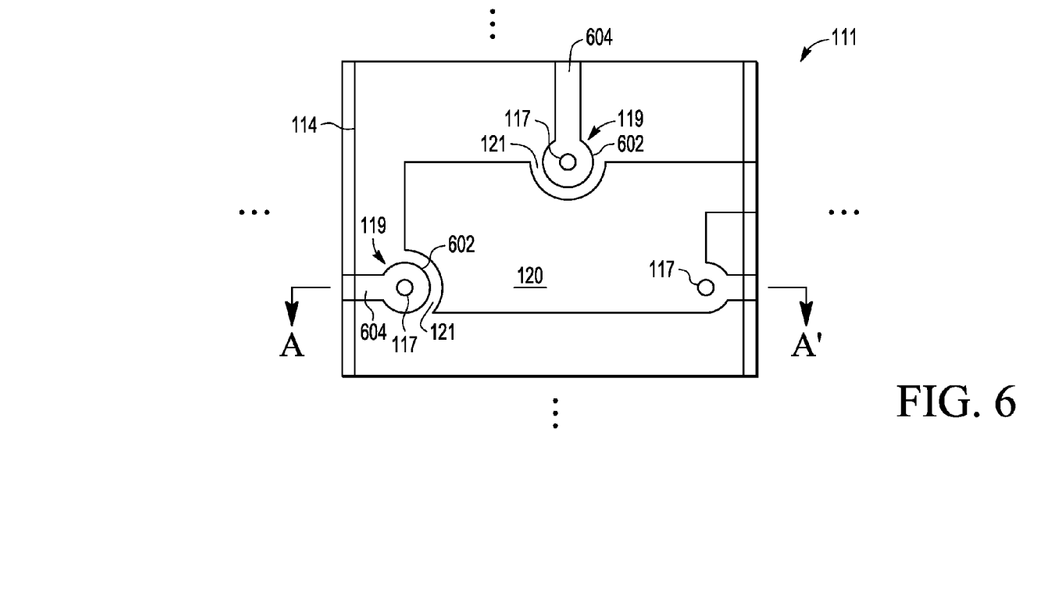
FIG. 6 is a partial top view of the semiconductor device of FIG. 5.

FIG. 6 is a partial top view of single die 111 of FIG. 5. Contact pads 118 are formed with a circular portion 602 having central opening 117, and a rectangular pad 604 extending from a subsection of the outer edge of circular portion 602 to bevels 114 (FIG. 5). Other suitable shapes for contact pads 119 and openings 117 can be used. Gaps 121 between contact pads 119 and conductive plane 120 extend around the circular portion 602 of contact pads 119 to separate contact pads 119 from conductive plane 120. Conductive plane 120 typically covers inner sections of die 111 around contact pads 119, and in some sections, covers edge bevels 114. Die 111 will be independent of other circuitry/die on the wafer 100 after die 111 is singulated along scribe lines 112.

Figure 7:
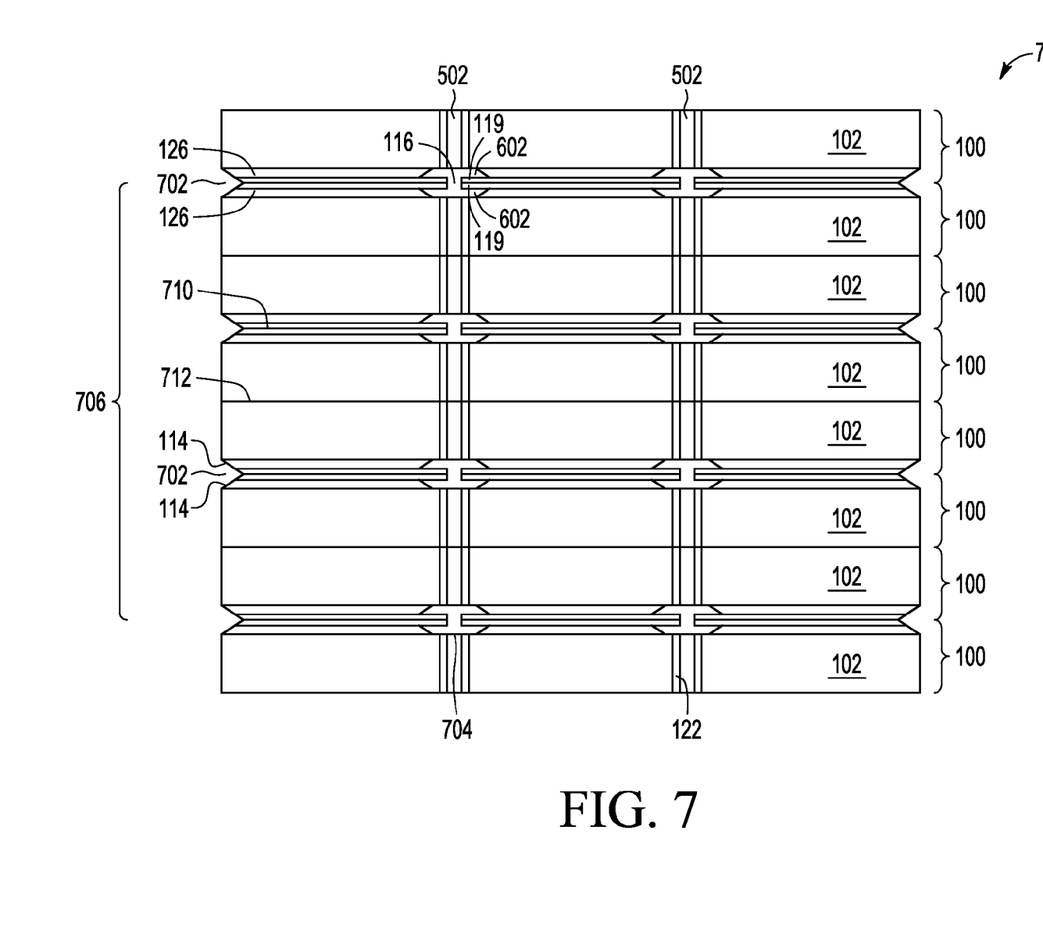
FIG. 7 is a partial side cross-sectional view of a group of stacked semiconductor device in accordance with an embodiment of the disclosure.

FIG. 7 is a partial side cross-sectional view of a semiconductor device 700 that includes groups of die 111 in wafers 100 stacked so that openings 116, 502 (FIG. 5) are aligned and coincident with one another to form a continuous opening through two or more die 111 in the stack. The top layer 126 of each wafer 100 faces the top layer 126 of an adjacent wafer 100. The bottom or inactive surfaces of substrate 102 of wafer 100 in the inner layers 706 face the bottom or inactive surfaces of another adjacent wafer 100, while the bottom surface of the substrate 102 of wafer 100 at the top and bottom surfaces of semiconductor device 700 face outward and are thus exposed to the external environment. V-shaped openings 702 are formed by pairs of edge bevels 114 (FIGS. 1-5) around the edges of the top layers 126 of wafers 100. Enlarged areas 704 are formed in the inner layers of semiconductor device 700 at the top of the openings 116 (FIG. 5) surrounded by contact pads 118 aligned and pairs of edge bevels 114 facing one another to form V-shaped openings 702. Notable, contact pads 119 of each die 111 are in direct contact with contact pads 119 of facing die 111, including the portion of contact pads 119 over cavities 602.

The top layers 126 of wafers 100 may be joined using a suitable adhesive insulating material 710 such as glass, epoxy, polyimide, acrylic, silicone, or other suitable attachment, bonding or fastening technique. The bottom sides of wafers 100 may be joined to one another using a layer of adhesive 712 such as insulative materials like glass, epoxy, polyimide, acrylic, silicone, or conductive attachment material, such as solder or eutectic alloys, or other suitable attachment, bonding, mounting, or fastening techniques.

Figure 8:
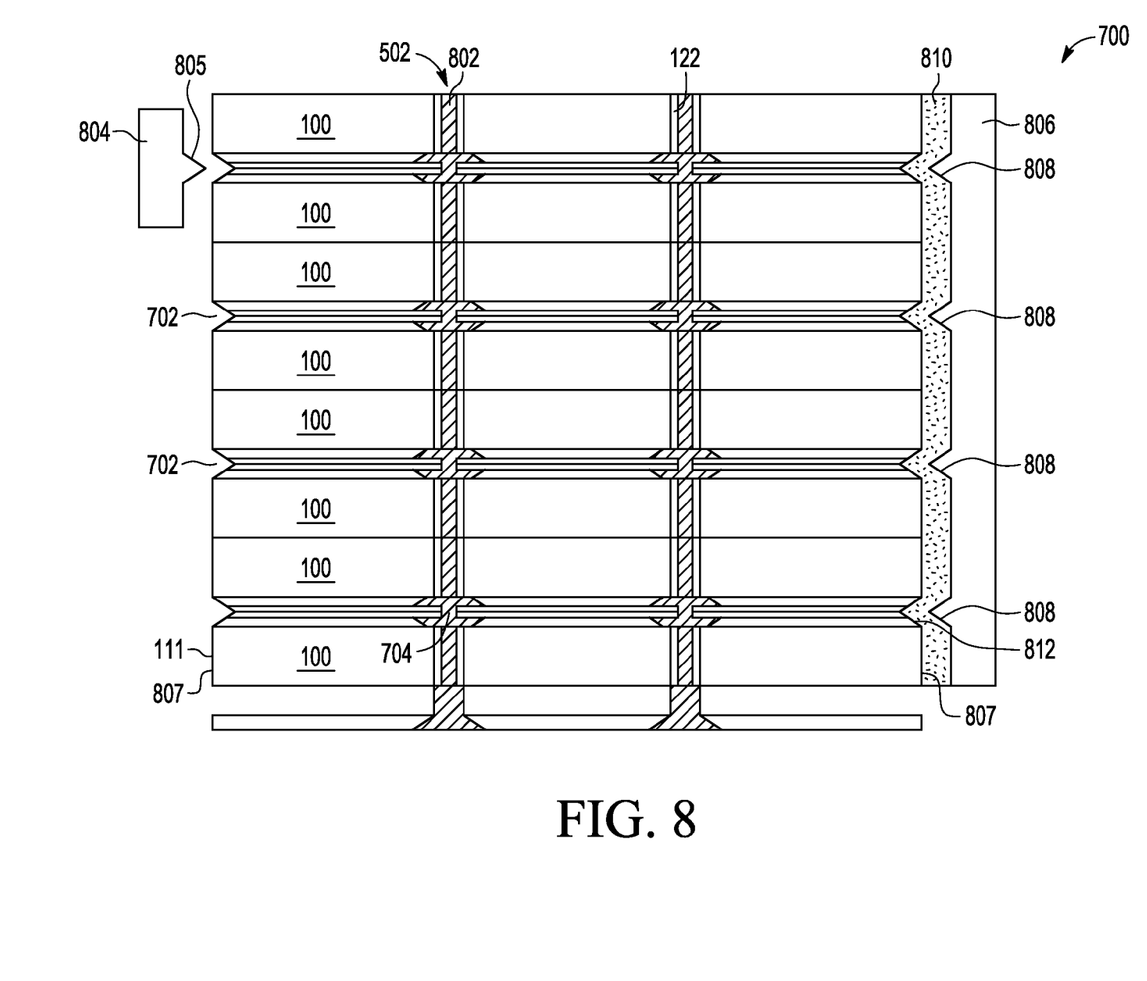
FIG. 8 is a partial side cross-sectional view of a group of stacked semiconductor device with continuous-fill vias, test probe, and heat sink structure in accordance with an embodiment of the disclosure.

FIG. 8 is a partial side cross-sectional view of semiconductor device 700 of FIG. 7 with openings 116, 502 (FIG. 5) and cavities 602 filled with conductive material after wafers 100 are stacked with openings 116, 502 aligned. The conductive material forms continuous through-silicon vias (TSVs) 802 through at least 2 of the stacked die 111 the semiconductor device 700. A greater amount of conductive material collects at enlarged areas 704 than in the rest of openings 116, 117, 502, thereby strengthening and improving the reliability of electrical coupling between the contact pads 119 of facing wafers 100. Cantilevered contact pads 119 also improve a stronger and more reliable connection with the conductive material due to the large surface area in contact with the conductive material.

Any suitable material for conducting electrical and/or optical signals can be used to form TSVs 802 in openings 116, 117, 502, such as copper, copper alloys, aluminum, tungsten, silver, polysilicon, silicon, conductive polymers, doped carbon nanotubes, polyacrylates, polystyrenics, and combinations thereof. In one embodiment at least one via comprises an electrically conducting material and at least on other via comprises an optically conductive material such as silicon. One alternative is forming the conductive material in openings 116, 117, 502 and cavities 602 by depositing a seed layer and then performing an electroplating process. Other alternatives that can be used to form the conductive material in TSVs 802 include: fusible metal powder such as titanium or molybdenum powder; plastic balls coated with a conductive material, such as the Micropearl SOL product from Sekisui America Corporation in Mt. Laurel, N.J.; reinforced solder columns, such as those available from Six Sigma Corporation in Milpitas, Calif.; a core wire inserted through openings 116 as a seed layer combined with copper, conductive polymer, or other suitable electroplating process; and/or nickel nanotubes or nanotubes formed of carbon that can be doped with iodine or bromine to achieve the desired conductive properties Once wafers 100 are stacked, the TSVs 802 are formed, and the die 111 are singulated, openings 702 are formed between the die 111 by bevels 114, test probe 804 can be used to test the functionality of wafers 100 individually by aligning the probe 804 to the openings 702 and contacting at least one contact pad a bevel 114 on die 111. The tip 805 of probe 804 can be V-shaped so that probe 804 will be aligned with respect to opening 702. Since there are edge bevels 114 between each pair of wafers 100, all wafers 100 can be tested by probe 804 independently of one another as long as the tip 805 of probe 804 is only coupling to one side or probe pad of the edge bevel 702 that corresponds to the wafer 100 being tested.

When two die 111 are stacked face to face, a first die 111 is in a first orientation and a second die 111 is in a mirror image orientation relative to the first die. Die 111 can be configured so that the capture pads 108 for the first die 111 align to the mirror imaged capture pads 108 of the second die 111. In one embodiment capture pads 108 are aligned to the center spine of the die 111 so the capture pads 108 will align to corresponding inputs or outputs of the two die 111 after stacking. In some embodiments, capture pads 108 functionally coupling address or data signals may be placed symmetrically away from the center spine of die 111 so that when active surfaces of first and second die 111 are stacked face to face, a first capture pad 108 coupling to first address input of said first die 111 will couple to a second address input of said second die 111 and second capture pads 108 of said first die 111 will couple to a first data input of said first die 111 and to a second data input of said second die 111.

Note that wafers 100 can be singulated, or separated into stacks of die 111 to allow individual stacks of die 111 to be tested. Thus in some embodiments, the term semiconductor device 700 as used herein can be considered a stack of die 111 or a stack of wafers 100. Additionally, some wafers 100 or die 111 in a stack may not include edge bevels 114, but may still be interspersed in a stack of wafers 100 and die 111 with edge bevels 114.

Figure 9:
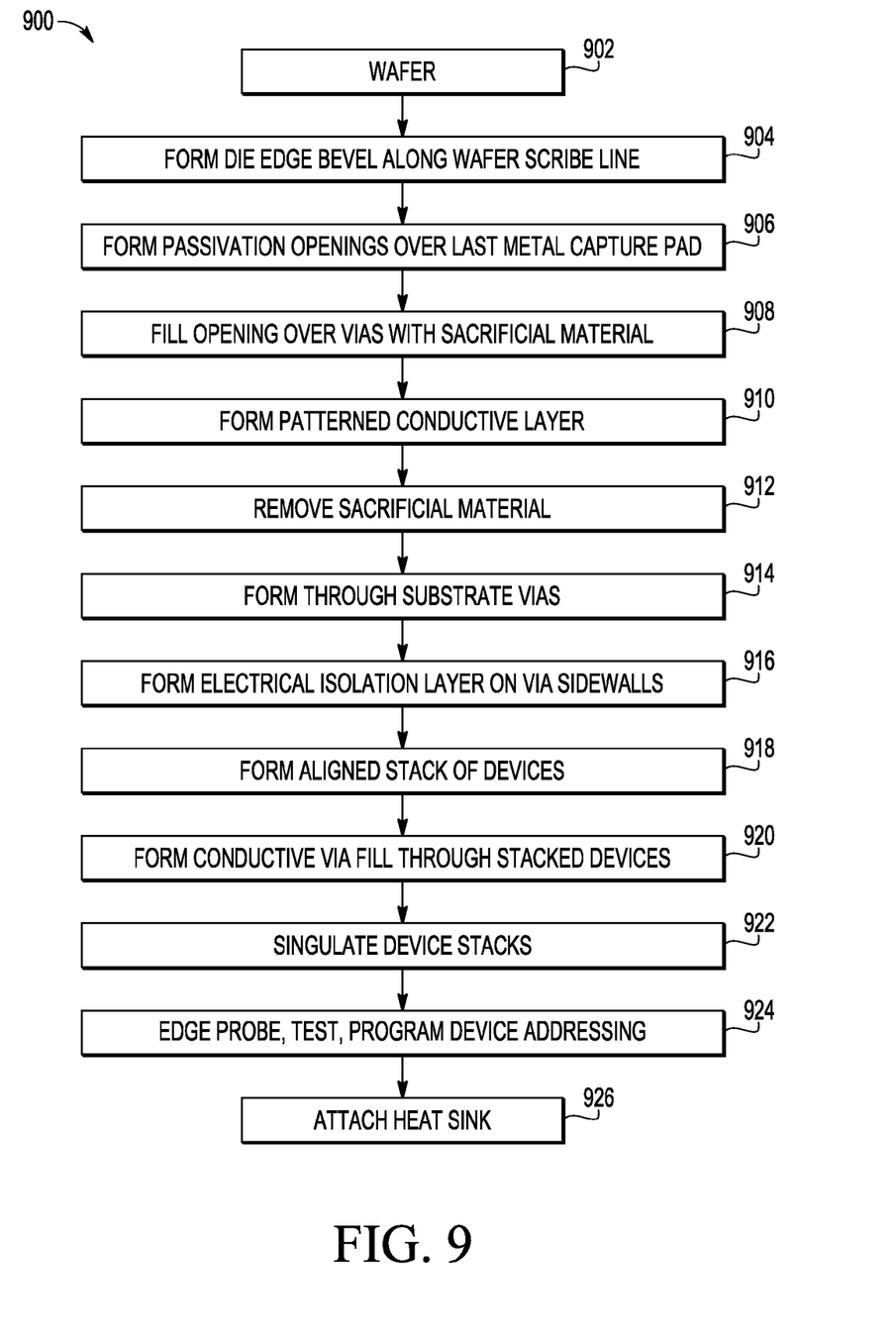
FIG. 9 is a flow diagram of an embodiment of a method for forming the semiconductor device of FIGS. 1-8.

Once testing is complete, probe 804 can be used to selectively apply current to program fuses in the semiconductor device 700. Heat sink structure 806 can be attached to opening 702 on one or more sides 807 of semiconductor device 700. Heat sink structure 806 can have one or more protruding portions 808 that are spaced and shaped to thermally couple to the inner surfaces of corresponding openings 702 when heat sink structure 806 is positioned adjacent to semiconductor device 700. A layer of thermally conductive material 810 can be positioned between heat sink 806 and semiconductor device 700 to improve heat transfer from the device to the heat sink. Conductive material 810 can include protruding portions 812 that are spaced and shaped to contact inner surfaces of corresponding openings 702 when heat sink structure 806 is positioned adjacent to semiconductor device 700. The heat sink may comprise an electrically conductive material or an insulating material. The heat sink 806 can be formed of aluminum, aluminum alloys, copper, copper alloys, boron nitride, aluminum nitride, diamond, carbon nanotubes, and combinations thereof. The thermally conductive material 810 can be a silicone or epoxy-resin based material containing suspended carbon nanotubes, or beryllium oxide, aluminum nitride, boron nitride, or diamond powders. In other embodiments, the thermally conductive material can be a phase-change metal alloy, a graphene-based adhesive or the like. In one embodiment the heat sink thermally couples to conductive plane 120 for improved heat removal FIG. 9 is a flow diagram of an embodiment of a method for forming semiconductor device 700 starting with wafer 100 of FIG. 1 in process 902. The wafer has been processed to include one or more layers of active circuitry and interconnects. A layer of passivation material is typically applied over the circuitry and interconnects. The passivation material can be inorganic and/or organic material such as silicon nitride, polyimide, or benzocyclobutene, among others. Process 904 includes forming bevels along vertical and horizontal scribe lines of the wafer using a laser, saw, or other suitable equipment. The bevels can have a V-shape or other suitable shape.

Process 906 includes forming openings in the passivation material to expose openings in capture pads that have been formed in the last or uppermost metal layer of the wafer. The openings in the passivation material can be formed using a standard etch and/or photoimageable or patterning techniques.

Process 908 includes filling the openings in the passivation material with a sacrificial material such as an oxide or other selectively removable material. The sacrificial material provides a base for cantilevered contact pads that are formed as part of a patterned conductive layer during process 910. The openings in and above the capture pads are left uncovered by the passivation material and the conductive layer, but are covered by the sacrificial material. The contact pads and conductive planes in the conductive layer are separated from one another by gaps in the conductive material. The contact pads are patterned over and in contact with the sacrificial material. The conductive planes may be formed over other capture pads as required by the circuitry on the wafer.

Process 912 includes removing the sacrificial material between the capture pads and the contact pads, leaving a cavity between the capture pads and the contact pads. The cavity can have any suitable shape. Sacrificial material may be removed by etching or other suitable techniques. The etch process may be accomplished in single etch process or multiple etch processes. The sacrificial material and removal process can be chosen so that other exposed films, materials, or structures are not affected during the removal process. The exception is where there is a distinct difference in thickness or rate of removal between the two elements. For example, doped oxide films such as BPSG or BPTEOS etch more rapidly than standard non-doped oxides, so materials with different etch rates may be used to avoid removing one material while the sacrificial material is removed.

In cases where the sacrificial material is a doped or undoped oxide, wet etch chemistries such as hydrflouric acid or similar may be used. Given the cantilevered contact pads (119, FIG. 5), an isotropic component to the etch can be used to remove the sacrificial material. Dry etches with isotropic components such as $NF_3$, high pressure $CF_4$, or similar may be used.

Alternatively, the sacrificial material may be a patterned organic material capable of withstanding the formation of the cantilevered contact pads, but later removed during process 912 through ashing.

Process 914 can include extending the openings in the capture pads through the other layers of the wafer to form through substrate vias (TSVs). The openings for the TSVs may be formed by etching, milling, laser, or other suitable techniques.

Process 916 can include forming an electrical isolation layer on the sidewalls of the TSVs by depositing insulating material, epitaxially growing insulating material, or other suitable technique.

Process 918 includes forming a stack of wafers so that the openings in the TSVs are aligned in a continuous column through the stack. If the wafers have been singulated into individual die, then the die may be stacked so that the openings in the TSVs are aligned in a continuous column through the stack. Each wafer or die has a first major surface and a second major surface the first major surface. The first major surface of each wafer or die includes active circuitry and, when stacked, faces the first major surface of a second wafer or die such that the first major surfaces of the first and second wafer/die are between the second major surfaces of the first and second wafer/die. The first major surface of a third wafer/die faces the first major surface of a fourth wafer/die such that the first major surfaces of the third and fourth wafer/die are between the second major surfaces of the third and fourth wafer/die. The second major surface of the second wafer/die faces the second major surface of the third wafer/die, such that the second major surfaces of the second and third wafer/die are between the first major surfaces of the second and third wafer/die. At least one continuous conductive via extends from the second major surface of the first wafer/die, through the first wafer/die, second wafer/die, and third wafer/die.

Process 920 includes filling the TSVs with conductive material using electroplating, fusible metal powder, plastic balls coated with a conductive material, reinforced solder columns, a core wire inserted through the openings as a seed layer combined with copper, conductive polymer, or other suitable electroplating process; and/or nanotubes formed of carbon or metals, as just some examples. Other suitable techniques and materials for filling the TSVs can be used. The conductive material forms a continuous conductive path through the TSVs with additional build-up of conductive material at the openings between TSVs on each die (as shown for example by enlarged areas 704 in FIGS. 7 and 8).

If the wafers have not already been singulated into individual die, then the stacked die may be singulated in process 922 after the TSVs are filled with conductive material. Since the V-shaped grooves in the scribe streets are covered with conductive material, probe pads are exposed at the edge bevels once the die are singulated.

Process 924 includes probing the stacked semiconductor device by inserting one or more probe tips into a respective opening between the edge bevels. The probe tips electrically contact at least one of the probe pads for a pair of wafers or die in the stack to test functionality of each wafer or die. Additionally, if the active circuitry of the semiconductor devices includes one or more fuses coupled to a respective probe pad, current may be selectively applied to the probe pad(s) via the probe(s) to program the fuses After test probing, process 926 can include attaching a heat sink to the vertical side of the stacked semiconductor device. The heat sink can comprise one or more protruding portions that are inserted into the beveled edges of the stacked semiconductor device to contact the probe pads of respective semiconductor devices. Further, a layer of thermally conductive material may be inserted between the stacked semiconductor device and the heat sink to improve heat transfer. The thermally conductive material may be configured to conform to the protrusions that contact the probe pads at the edge bevels of the stack to increase the amount of area from which heat may be dissipated from the stacked semiconductor device.

By now it should be appreciated that in some embodiments, a stacked semiconductor device is disclosed that includes a first semiconductor device having a first major surface and a second major surface opposite the first major surface, the first major surface of the first semiconductor device with active circuitry. A second semiconductor device has a first major surface and a second major surface opposite the first major surface, the first major surface of the second semiconductor device with active circuitry. The first and second semiconductor devices are stacked so that the first major surface of the first semiconductor device faces the first major surface of the second semiconductor device. At least one continuous conductive via extends from the second major surface of the first semiconductor device to the first major surface of the second semiconductor device. The active circuitry includes a contact pad having an opening aligned with the conductive via. Conductive material fills a cavity adjacent to the contact pad and is in contact with one side of the contact pad. Another side of the contact pad of the first semiconductor device faces and is in contact with another side of the contact pad of the second semiconductor device.

In another aspect, the at least one conductive via has a first width at an interface between the first major surfaces of the first and second semiconductor devices and a second width between the first and second major surfaces of the first semiconductor device. The first width is greater than the second width.

In another aspect, the stacked semiconductor device further comprises a third semiconductor device having a first major surface and a second major surface opposite the first major surface. The first major surface of the third semiconductor device includes active circuitry. A fourth semiconductor device has a first major surface and a second major surface opposite the first major surface. The first major surface of the fourth semiconductor device has active circuitry. The first, second, third, and fourth semiconductor devices are stacked so that the first major surface of the third semiconductor device faces the first major surface of the fourth semiconductor device, and the second major surface of the second semiconductor device faces the second major surface of the third semiconductor device. The at least one continuous conductive via extends from the second major surface of the first semiconductor device to the first major surface of the fourth semiconductor device. Another side of the contact pad of the third semiconductor device faces and is in contact with another side of the contact pad of the fourth semiconductor device.

In another aspect, the at least one conductive via has a first width at an interface between the first major surfaces of the first and second semiconductor devices and a second width between the first and second major surfaces of the first semiconductor device. The first width is greater than the second width. The at least one conductive via has a third width at an interface between the first major surfaces of the third and fourth semiconductor devices and a fourth width between the first and second major surfaces of the third semiconductor device. The third width is greater than the fourth width.

In another aspect, each of the first and second semiconductor devices is further characterized as one of a group consisting of: a semiconductor die and a memory device.

In another aspect, each of the first, second, third, and fourth semiconductor devices is further characterized as one of a group consisting of: a semiconductor die and a memory device.

In another aspect, the cavity is formed as an opening in a passivation layer adjacent a capture pad, the capture pad is connected to an interconnect.

In another aspect, each of the first, second, third, and fourth semiconductor devices comprises a conductive plane, and wherein one or more continuous conductive vias of the at least one continuous conductive via is electrically coupled to each of the conductive planes.

In another aspect, one or more continuous conductive vias of the at least one continuous conductive via couple a signal between the active circuitry of each of the first, second, third, and fourth semiconductor devices.

In another aspect, each of the first, second, third, and fourth semiconductor devices comprises a bevel at the first major surface on at least one side of the semiconductor device.

In another aspect, the beveled edge of the first semiconductor device faces the beveled edge of the second semiconductor device such that a first opening is formed between the beveled edges of the first and second semiconductor devices on a first vertical side of the stacked semiconductor device. The first vertical side of the stacked semiconductor device is substantially perpendicular to each of the first and second major surfaces of the first, second, third, and fourth semiconductor devices. The beveled edge of the third semiconductor device faces the beveled edge of the fourth semiconductor device such that a second opening is formed between the beveled edges of the third and fourth semiconductor devices on the first vertical side of the stacked semiconductor device.

In another aspect, each continuous conductive via of the at least one continuous conductive via extends through the fourth semiconductor device to the second major surface of the fourth semiconductor device.

In other embodiments, a method for forming a stacked semiconductor device can comprise forming a first plurality of openings in a passivation layer of a first semiconductor device, the first semiconductor device having a first major surface and a second major surface opposite the first major surface, the first major surface of the first semiconductor device having active circuitry. Each of the first plurality of openings extends from the first major surface of the first semiconductor device to a capture pad of the first semiconductor device. A second plurality of openings are in a passivation layer of a second semiconductor device. The second semiconductor device has a first major surface and a second major surface opposite the first major surface. The first major surface of the second semiconductor device has active circuitry. Each of the second plurality of openings extends from the first major surface of the second semiconductor device to a capture pad of the second semiconductor device. The openings in the passivation layer of the first and second semiconductor devices are filled with a sacrificial material. A patterned conductive layer is formed over the passivation layer and the sacrificial material of the first and second semiconductor devices. The patterned conductive layer includes at least one contact pad with an opening. The opening in the contact pad in the first semiconductor device are aligned with one of the first plurality of openings and the opening in the contact pad in the second semiconductor device being aligned with one of the second plurality of openings. The sacrificial material of the first and second semiconductor devices is removed. The first and second semiconductor devices are stacked to form the stacked semiconductor device, such that the first contact pad of the first semiconductor device directly faces and is in contact with the contact pad of the second semiconductor device. The openings in the contact pads and each of the first plurality of openings and second plurality of openings are aligned. At least one continuous conductive via is formed extending through the openings in the contact pads and the openings in the passivation layers from the second major surface of the first semiconductor device, through the first semiconductor device and the second semiconductor device. Each continuous conductive via of the at least one continuous conductive via extends from the second major surface of the first semiconductor device to the first major surface of the second semiconductor device. The at least one continuous conductive via is filled with conductive material. The conductive material is in contact with the contact pads and the capture pads.

In another aspect, a third plurality of openings is formed in a passivation layer of a third semiconductor device. The third semiconductor device has a first major surface and a second major surface opposite the first major surface. The first major surface of the third semiconductor device has active circuitry. Each of the third plurality of openings extends from the first major surface of the third semiconductor device to a capture pad of the third semiconductor device. A fourth semiconductor device is provided that has a first major surface and a second major surface opposite the first major surface. The first major surface of the fourth semiconductor device has active circuitry. Each of the fourth plurality of openings extends from the first major surface of the fourth semiconductor device to a capture pad of the fourth semiconductor device. The openings in the passivation layer of the third and fourth semiconductor devices are filled with a sacrificial material. A patterned conductive layer is formed over the passivation layer and the sacrificial material of the third and fourth semiconductor devices. The patterned conductive layer includes at least one contact pad with an opening. The opening in the contact pad in the third semiconductor device is aligned with one of the third plurality of openings and the opening in the contact pad in the fourth semiconductor device is aligned with one of the fourth plurality of openings. The sacrificial material of the third and fourth semiconductor devices is removed. The first, second, third, and fourth semiconductor devices are stacked to further form the stacked semiconductor device, such that the second major surface of the second semiconductor device directly faces the second major surface of the third semiconductor device, and the contact pad of the third semiconductor device directly faces the contact pad of the fourth semiconductor device. Each of the first plurality of openings, second plurality of openings, third plurality of openings, and fourth plurality of openings are aligned. At least one continuous conductive via extends through the openings in the contact pads and the openings in the passivation layers from the second major surface of the first semiconductor device, through the first, second and third semiconductor device to the first major surface of the fourth semiconductor device before the filling the at least one continuous conductive via.

In another aspect, forming the fourth plurality of openings in the fourth semiconductor device can include extending each of the fourth plurality of openings from the first major surface of the fourth semiconductor device, through the fourth semiconductor device to the second major surface of the fourth semiconductor device.

In another aspect, after the filling, the stacked first, second, third, and fourth semiconductor devices can be singulated to form a singulated stacked semiconductor device.

In another aspect, removing the sacrificial material can include at least one of a group consisting of: selective etching, ashing, wet etching, and dry etching.

In another aspect, forming each of the first, second, and third plurality of openings can be performed such that each opening of the first plurality of openings has a greater diameter at the first major surface than the second major surface of the first semiconductor device. Each opening of the second plurality of openings has a greater diameter at the first major surface than the second major surface of the second semiconductor device. Each opening of the third plurality of openings has a greater diameter at the first major surface than the second major surface of the third semiconductor device. The diameter of the first, second, and third plurality of openings is greater than the opening of the contact pad.

In another aspect, the sacrificial material is one of a group consisting of: a dielectric material, a doped oxide, an undoped oxide, and an organic material.

In still other embodiments, a stacked semiconductor device can comprise a first plurality of openings in a passivation layer of a first semiconductor device. The first semiconductor device has a first major surface and a second major surface opposite the first major surface. The first major surface of the first semiconductor device has active circuitry, wherein each of the first plurality of openings extends from the first major surface of the first semiconductor device to a capture pad of the first semiconductor device. A second plurality of openings are in a passivation layer of a second semiconductor device. The second semiconductor device has a first major surface and a second major surface opposite the first major surface. The first major surface of the second semiconductor device has active circuitry. Each of the second plurality of openings extends from the first major surface of the second semiconductor device to a capture pad of the second semiconductor device. A patterned conductive layer is formed over a passivation layer of the first and second semiconductor devices. The patterned conductive layer includes at least one contact pad with an opening. The opening in the contact pad in the first semiconductor device is aligned with one of the first plurality of openings. The opening in the contact pad in the second semiconductor device is aligned with one of the second plurality of openings. A portion of the contact pad adjacent the opening of the contact pad is cantilevered over the captured pad in the first and second semiconductor devices. The first and second semiconductor devices are stacked such that the first contact pad of the first semiconductor device directly faces and is in contact with the contact pad of the second semiconductor device. The openings in the contact pads and each of the first plurality of openings and second plurality of openings are aligned. At least one continuous conductive via extends through the openings in the contact pads. The openings in the passivation layers extend from the second major surface of the first semiconductor device, through the first semiconductor device and the second semiconductor device. Each continuous conductive via of the at least one continuous conductive via extends from the second major surface of the first semiconductor device to the first major surface of the second semiconductor device. The at least one continuous conductive via is filled with conductive material. The conductive material is in contact with the contact pads and the capture pads.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical or optical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A stacked semiconductor device comprising:
   a first semiconductor device having a first major surface and a second major surface opposite the first major surface, the first major surface of the first semiconductor device with active circuitry;
   a second semiconductor device having a first major surface and a second major surface opposite the first major surface, the first major surface of the second semiconductor device with active circuitry, wherein the first and second semiconductor devices are stacked so that the first major surface of the first semiconductor device faces the first major surface of the second semiconductor device;
   at least one continuous conductive via, wherein each continuous conductive via of the at least one continuous conductive via extends from the second major surface of the first semiconductor device to the first major surface of the second semiconductor device; and
   a contact pad having an opening aligned with the conductive via, wherein conductive material fills a cavity adjacent to the contact pad and is in contact with one side of the contact pad, another side of the contact pad of the first semiconductor device faces and is in contact with another side of the contact pad of the second semiconductor device.

2. The stacked semiconductor device of claim 1, wherein: each of the at least one conductive via has a first width at an interface between the first major surfaces of the first and second semiconductor devices and a second width between the first and second major surfaces of the first semiconductor device, wherein the first width is greater than the second width.

3. The stacked semiconductor device of claim 1, further comprising:
a third semiconductor device having a first major surface and a second major surface opposite the first major surface, the first major surface of the third semiconductor device with active circuitry;
a fourth semiconductor device having a first major surface and a second major surface opposite the first major surface, the first major surface of the fourth semiconductor device with active circuitry, wherein the first, second, third, and fourth semiconductor devices are stacked so that:
the first major surface of the third semiconductor device faces the first major surface of the fourth semiconductor device; and
the second major surface of the second semiconductor device faces the second major surface of the third semiconductor device;
wherein the at least one continuous conductive via extends from the second major surface of the first semiconductor device to the first major surface of the fourth semiconductor device, and
another side of the contact pad of the third semiconductor device faces and is in contact with another side of the contact pad of the fourth semiconductor device.

4. The stacked semiconductor device of claim 1, wherein: each of the at least one conductive via has a first width at an interface between the first major surfaces of the first and second semiconductor devices and a second width between the first and second major surfaces of the first semiconductor device, wherein the first width is greater than the second width; and
each of the at least one conductive via has a third width at an interface between the first major surfaces of the third and fourth semiconductor devices and a fourth width between the first and second major surfaces of the third semiconductor device, wherein the third width is greater than the fourth width.

5. The stacked semiconductor device of claim 1, wherein each of the first and second semiconductor devices is further characterized as one of a group consisting of: a semiconductor die and a memory device.

6. The stacked semiconductor device of claim 3, wherein each of the first, second, third, and fourth semiconductor devices is further characterized as one of a group consisting of: a semiconductor die and a memory device.

7. The stacked semiconductor device of claim 1, wherein the cavity is formed as an opening in a passivation layer adjacent a capture pad, the capture pad is connected to an interconnect.

8. The stacked semiconductor device of claim 3, wherein each of the first, second, third, and fourth semiconductor devices comprises a conductive plane, and wherein one or more continuous conductive vias of the at least one continuous conductive via is electrically coupled to each of the conductive planes.

9. The stacked semiconductor device of claim 3, wherein one or more continuous conductive vias of the at least one continuous conductive via is for coupling a signal between the active circuitry of each of the first, second, third, and fourth semiconductor devices.

10. The stacked semiconductor device of claim 3, wherein each of the first, second, third, and fourth semiconductor devices comprises a bevel at the first major surface on at least one side of the semiconductor device.

11. The stacked semiconductor device of claim 8, wherein:
the beveled edge of the first semiconductor device faces the beveled edge of the second semiconductor device such that a first opening is formed between the beveled edges of the first and second semiconductor devices on a first vertical side of the stacked semiconductor device, the first vertical side of the stacked semiconductor device being substantially perpendicular to each of the first and second major surfaces of the first, second, third, and fourth semiconductor devices; and
the beveled edge of the third semiconductor device faces the beveled edge of the fourth semiconductor device such that a second opening is formed between the beveled edges of the third and fourth semiconductor devices on the first vertical side of the stacked semiconductor device.

12. The stacked semiconductor device of claim 3, wherein each continuous conductive via of the at least one continuous conductive via extends through the fourth semiconductor device to the second major surface of the fourth semiconductor device.

13. A stacked semiconductor device comprising:
a first plurality of openings in a passivation layer of a first semiconductor device, the first semiconductor device having a first major surface and a second major surface opposite the first major surface, the first major surface of the first semiconductor device having active circuitry, wherein each of the first plurality of openings extends from the first major surface of the first semiconductor device to a capture pad of the first semiconductor device;
a second plurality of openings in a passivation layer of a second semiconductor device, the second semiconductor device having a first major surface and a second major surface opposite the first major surface, the first major surface of the second semiconductor device having active circuitry, wherein each of the second plurality of openings extends from the first major surface of the second semiconductor device to a capture pad of the second semiconductor device;
a patterned conductive layer over a passivation layer of the first and second semiconductor devices, the patterned conductive layer including at least one contact pad with an opening, the opening in the contact pad in the first semiconductor device being aligned with one of the first plurality of openings and the opening in the contact pad in the second semiconductor device being aligned with one of the second plurality of openings, a portion of the contact pad adjacent the opening of the contact pad is cantilevered over the capture pad in the first and second semiconductor devices;
the first and second semiconductor devices are stacked such that the first contact pad of the first semiconductor device directly faces and is in contact with the contact pad of the second semiconductor device, and wherein the openings in the contact pads and each of the first plurality of openings and second plurality of openings are aligned;

at least one continuous conductive via extends through the openings in the contact pads and the openings in the passivation layers from the second major surface of the first semiconductor device, through the first semiconductor device and the second semiconductor device, each continuous conductive via of the at least one continuous conductive via extends from the second major surface of the first semiconductor device to the first major surface of the second semiconductor device; and the at least one continuous conductive via is filled with conductive material, the conductive material is in contact with the contact pads and the capture pads.

\* \* \* \* \*